(12) United States Patent
Harkness, IV et al.

(10) Patent No.: US 9,911,583 B1
(45) Date of Patent: Mar. 6, 2018

(54) APPARATUS FOR ENHANCED PHYSICAL VAPOR DEPOSITION

(71) Applicant: HIA, Inc., Milpitas, CA (US)

(72) Inventors: Samuel D. Harkness, IV, Albany, CA (US); Quang N. Tran, San Jose, CA (US)

(73) Assignee: HIA, Inc., Milpitas, CA (US)

( * ) Notice: Subject to any disclaimer, the term of this patent is extended or adjusted under 35 U.S.C. 154(b) by 10 days.

(21) Appl. No.: 15/065,704

(22) Filed: Mar. 9, 2016

Related U.S. Application Data

(60) Provisional application No. 62/133,190, filed on Mar. 13, 2015.

(51) Int. Cl.
| | | |
|---|---|---|
| *H01J 37/34* | (2006.01) | |
| *C23C 14/34* | (2006.01) | |
| *C23C 14/35* | (2006.01) | |

(52) U.S. Cl.
CPC ...... *H01J 37/3417* (2013.01); *C23C 14/3407* (2013.01); *C23C 14/3414* (2013.01); *C23C 14/3464* (2013.01); *C23C 14/3478* (2013.01); *C23C 14/352* (2013.01); *C23C 14/355* (2013.01); *H01J 37/345* (2013.01); *H01J 37/3426* (2013.01); *H01J 37/3452* (2013.01); *C23C 14/35* (2013.01); *H01J 37/3405* (2013.01)

(58) Field of Classification Search
CPC .. H01J 37/3417; H01J 37/345; H01J 37/3452; H01J 37/3405; H01J 37/3426; C23C 14/3407; C23C 14/35; C23C 14/3414; C23C 14/352; C23C 14/3464; C23C 14/3478; C23C 14/355
See application file for complete search history.

(56) References Cited

U.S. PATENT DOCUMENTS

| | | | | |
|---|---|---|---|---|
| 4,963,239 A | * | 10/1990 | Shimamura | C23C 14/34 204/192.12 |
| 5,580,428 A | * | 12/1996 | Krivokapic | C23C 14/3407 204/192.12 |
| 8,398,832 B2 | * | 3/2013 | Nulman | H01J 37/321 204/298.06 |
| 2003/0209431 A1 | * | 11/2003 | Brown | H01J 37/3452 204/298.19 |
| 2007/0074968 A1 | * | 4/2007 | Vukovic | C23C 14/358 204/192.1 |

FOREIGN PATENT DOCUMENTS

JP         09249961 A    *  9/1997

OTHER PUBLICATIONS

Machine Translation JP09249961A.*

* cited by examiner

*Primary Examiner* — Michael A Band
(74) *Attorney, Agent, or Firm* — Cooley LLP

(57) ABSTRACT

An apparatus has a primary cathode configured for free space interaction with a substrate operative as an anode. A first annular cathode faces a second annular cathode. The primary cathode, the first annular cathode, the second annular cathode are axially aligned. The outer diameters of the first annular cathode and the second annular cathode correspond to the outer diameter of the primary cathode. The primary cathode provisions deposited material on the substrate with controllable plasma density to levels above $1 \times 10^{18}$ m$^{-3}$, with ignition capability above 0.05 Pa.

20 Claims, 6 Drawing Sheets

APPARATUS FOR ENHANCED PHYSICAL VAPOR DEPOSITION

CROSS-REFERENCE TO RELATED APPLICATION

This application claims priority to U.S. Provisional Patent Application 62/133,190, filed Mar. 13, 2015, the contents of which are incorporated herein by reference.

FIELD OF THE INVENTION

This invention relates generally to semiconductor processing equipment. More particularly, this invention relates to techniques for enhanced physical vapor deposition through a vacuum compatible deposition source with controllable plasma density.

BACKGROUND

Direct current (DC) diode sputtering is not efficient. That is, it is not efficient by the standard of the fraction of species backscattered from the target (sputtered) that are captured on a substrate surface. This inefficiency is attributable to the fact that higher working pressures (>10 mTorr) are required to facilitate the collisional frequency that initiates an avalanche-effect supply of ionizing electrons. Unfortunately, at elevated working pressures, the sputtered species (adsorbate) are readily scattered by the working gas atoms and ions. As a result, a diminishing portion of the working gas atoms and ions actually makes it to the substrate. The balance is later found deposited upon the shielding and other chamber surfaces.

Magnetron solutions are the standard in the industry; however, while they commonly offer high deposition rates at lower pressure, and full surface erosion, they are limited to processing at ~0.5 Pa (Ar), and deliver an adsorbate that is neutral. Unbalancing the magnetic strength of the magnetron is effective at increasing the ionization fraction (adsorbate), but requires higher ignition pressure. Also, since the band of highly ionizing electrons is confined to a narrower spatial distribution, use of this configuration typically exhibits lower than desired target utilization.

Radio frequency magnetrons (rf-magnetrons) are effective in increasing the ionization cross section, thereby reducing the critical pressure for sputtering, but require expensive setups (power supplies, matching boxes, etc.) and are not very compatible with changing loads (e.g., as in a pass-by sputter system).

In this context, a general solution is sought that offers very low pressure operation (<0.1 Pa) and high plasma density with ionic flow toward the substrate. A specific solution is also sought for processing diamond-like carbon (DLC). In the specific case of DLC, one typically observes a high concentration of graphitic carbon. It is well known that traditional sputtering including magnetron setups yield a predominantly neutral adsorbate. Without a highly ionized sputter and commensurately high electron density, the resultant plasma is not easily controlled with electron optics and electrostatic bias fields. This control of the adsorbate is richly sought after due to the incumbent abilities afforded the thin film designer in terms of film bombardment and control of the incident energy.

Filtered Cathodic Arc (FCA) is a known method by which DLC films are viably fabricated. FCA works by impinging a high current arc from a cathode made of the target material to an engineered anode. Highly localized energy then causes explosive evaporation with a large flux of ionizing electrons. This ejected plasma is then directed through a filter via magnetic fields. The evaporation event leads to a high degree of particulate formation via cavitation of the surface. These particulates are too heavy to follow the plasma through the various twist and turns in the applied magnetic field and thus are captured ex-situ to the work environment. However, a finite number of particles do make it through to the substrate mostly due to reflection from the various surfaces offered by the filter. As filtering is increased, the transfer efficiency noted as the fraction of those ions entering the filter to the total created, $\square$=Ii/If, is seldom reported greater than 5%. For this reason, it is found to be intractable to achieve deposition rates approaching 1 nm/s without very large input powers (>3 kW). Also, because the transfer efficiencies are so low, the amount of starting material is quite large depending on the desired "uptime" for continuous processing demands.

There is no currently available technology capable of simultaneously increasing the density of thin film carbon while maintaining compatibility with volume manufacturing rigors in industries including recording media for hard disc drives.

SUMMARY OF THE INVENTION

An apparatus has a primary cathode configured for free space interaction with a substrate operative as an anode. A first annular cathode faces a second annular cathode. The primary cathode, the first annular cathode, the second annular cathode are axially aligned. The outer diameters of the first annular cathode and the second annular cathode correspond to the outer diameter of the primary cathode. The primary cathode provisions deposited material on the substrate with controllable plasma density to levels above $1 \times 10^{18}$ m$^{-3}$, with ignition capability above 0.05 Pa.

BRIEF DESCRIPTION OF THE FIGURES

Like reference numerals refer to corresponding parts throughout the several views of the drawings.

DETAILED DESCRIPTION OF THE INVENTION

A sputter target comprises a slab of material affixed to a heat-sinking surface. This piece represents the substrate-facing target in the larger assembly and is responsible for the preponderance of collected material as a film.

Figure 1:
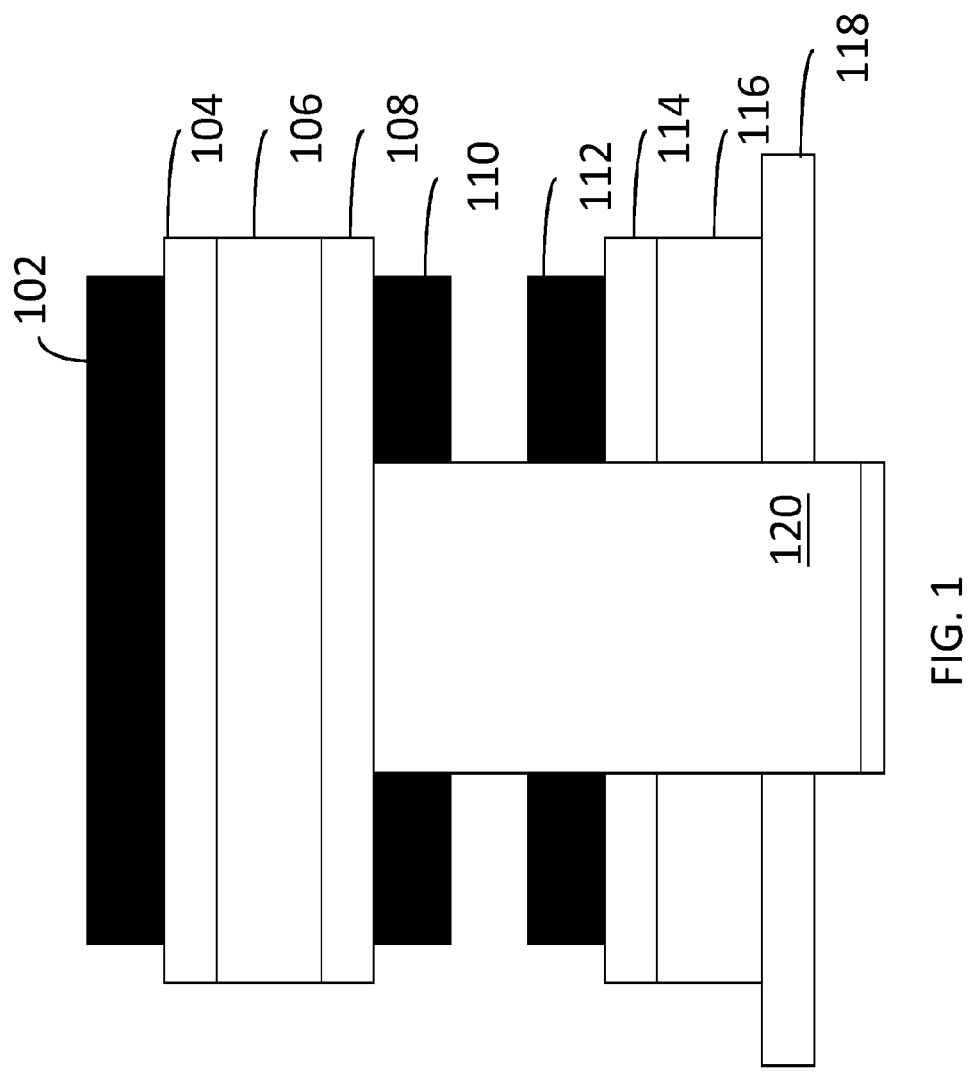
FIG. 1 is a simplified representation of a tri-target assembly utilized in accordance with an embodiment of the invention.

FIG. 1 illustrates a tri-target assembly 100 to process such a sputter target. The tri-target assembly 100 includes a primary cathode 102 positioned on a heatsink 104. The primary cathode 102 is configured for free space interaction with the substrate operative as an anode (not shown in FIG. 1; see FIGS. 2 and 6). An insulator 106 is connected to the heatsink 104 and heatsink 108, which is affixed to a first annular cathode 110. Opposite the first annular cathode 110 is a second annular cathode 112. The second annular cathode 112 is positioned on a heatsink 114, which is positioned on an insulator 116, which is attached to a vacuum flange 118.

The first annular cathode 110 and the second annular cathode 112 each have an outer diameter that is at or within the outer diameter of the primary cathode 102. The first annular cathode 110 and the second annular cathode 112 are each shaped as an annulus and are each concentrically situated with respect to the primary cathode 102. Each cathode has a metal composition, is an aluminum alloy or is carbon. The first annular cathode 112 and the second annular cathode 112 are separated between 10 and 30 mm, preferably approximately 25 mm.

A utility manifold 120 held at atmospheric pressure delivers power, cooling water and process gas (e.g., Ar). The primary cathode provisions deposited material on the substrate with controllable plasma density to levels above $1 \times 10^{18}$ m$^{-3}$, with ignition capability above 0.05 Pa.

Figure 2:
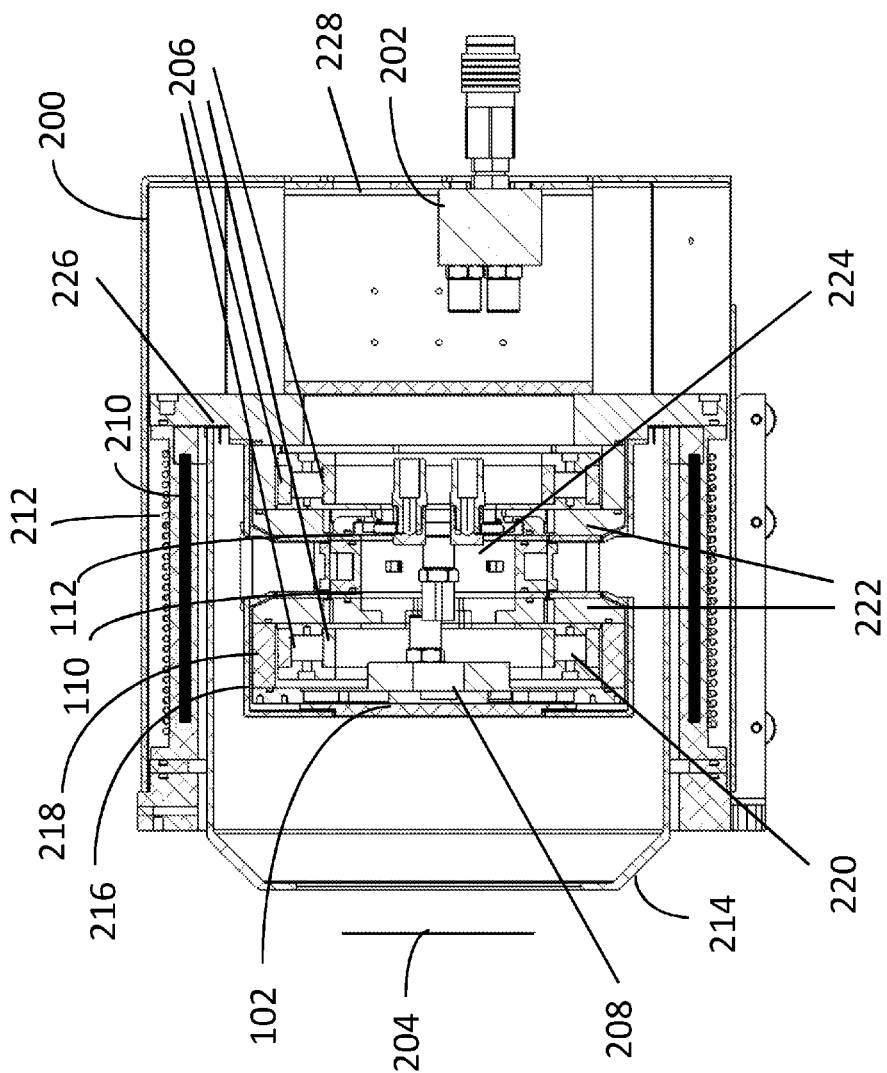
FIG. 2 is a detailed representation of the tri-target assembly utilized in accordance with an embodiment of the invention.

FIG. 2 is a more detailed representation of the tri-target assembly. The figure illustrates a housing 200 for enclosing the primary cathode 102, the first annular cathode 110 and the second annular cathode 112. The housing 200 includes a utility facility assembly 202. FIG. 2 also illustrates the substrate 204 to be treated.

FIG. 2 illustrates an arrangement of permanent magnets 206. The permanent magnets are situated behind the primary cathode 102, the first annular cathode 110 and the second annular cathode 112. The permanent magnets have aligned polarities (e.g., south of one magnet faces the top target and north of the oppositely situated magnet faces the bottom target surface). The arrangement of permanent magnets creates a free space magnetic field between 100 G to 800 G, preferably approximately 500 G.

A circular permanent magnet 208 is optionally, but not required, positioned in the center behind the primary cathode 102. The magnets 206 produce a uniaxial field across the annular cathode pair. This magnetic field is essential to the working order of the assembly as it allows for the remote generation of electrons that are used in the generation of plasma above the substrate 204.

The uniaxial field created by the parallel magnets in the annular apparatus also serves to drive a large pass through field through the primary cathode 102 and into the cavity between the primary cathode and the substrate 204 to be coated. The strength of this pass through field can be engineered with careful selection of magnetic strength with respect to the permanent magnets. We find most preferably that these magnets should be of the rare earth type with magnetic strength near 45 MGOe to produce in the disclosed assembly a field greater than 200 G through and above non-magnetic primary cathode target materials.

FIG. 2 also illustrates permanent magnets 210 with a wrap-around coil assembly 212. This additional sub-assembly (or can) is concentric to the primary cathode 102, the first annular cathode 110 and the second annular cathode 112. The distance between the additional sub-assembly and the cathodes is at least 10 mm and preferably between 20 to 100 mm.

The figure also illustrates a source shield 214 and facing target shields 216. The figure also illustrates insulation rings 218 (shown as 106, 116 on FIG. 1). Also depicted is primary cathode target heat-sink assembly 220 (e.g., including element 104 of FIG. 1). A facing target heat-sink assembly 222 (e.g., including elements 108, 114 of FIG. 1) is also depicted.

Element 224 is a ground shield for the first annular cathode 110 and the second annular cathode 112. Element 226 is a source mating plate with an adjustable spacer. Element 228 is a water and electrical interface guiding plate.

Figure 3:
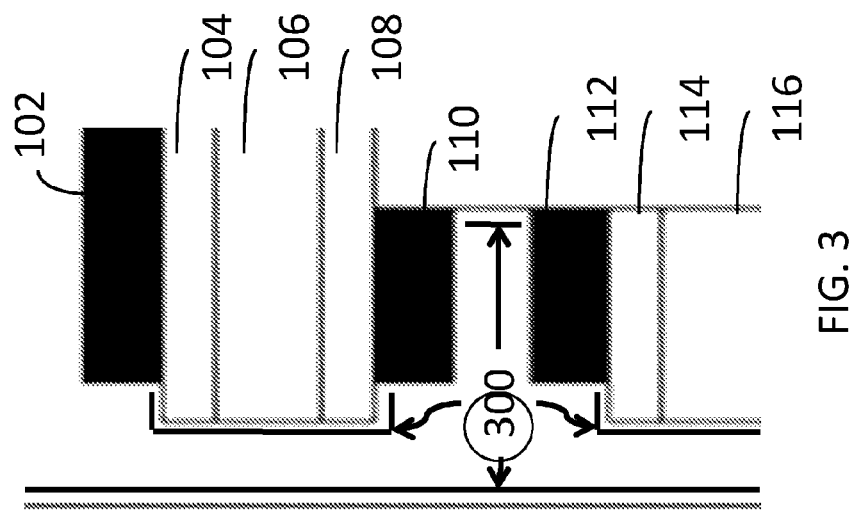
FIG. 3 illustrates ground shields utilized in accordance with an embodiment of the invention.

The identified shields provide grounded shielding to cover all surfaces associated with the design. This ensures that the magnetic cage contained facing-target plasma has an anode as thermalized electrons exiting the cage can find ground. Without a nearby ground plane, the facing-target system is unstable. A representation of this ground shield 300 implementation is shown in FIG. 3.

Figure 4:
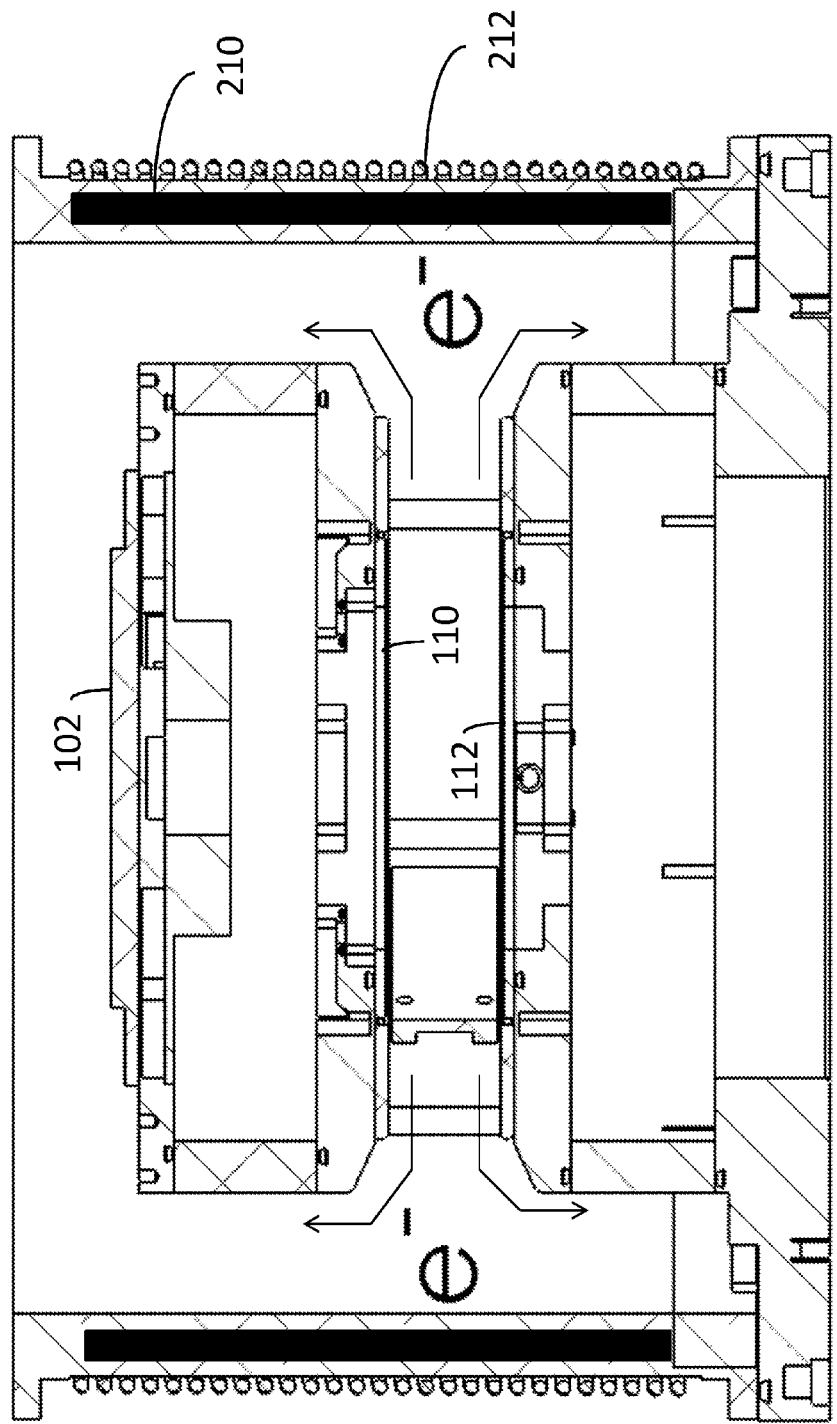
FIG. 4 illustrates the tri-target assembly and associated can assembly utilized in accordance with an embodiment of the invention.
Figure 5:
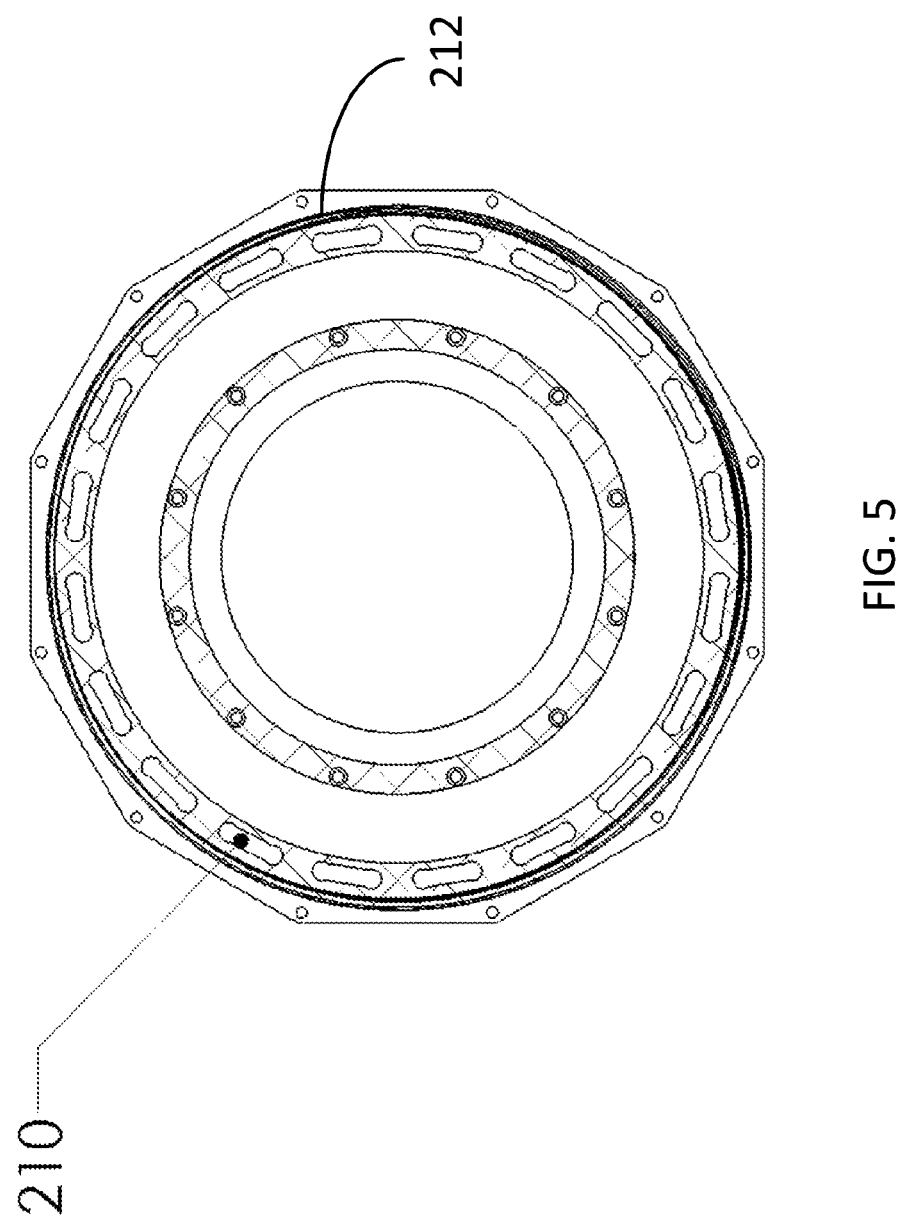
FIG. 5 is a top view of the can assembly.

Permanent magnets 210 with a wrap-around coil assembly 212 are referred to as a "can" that surrounds the tri-target assembly. The can serves multiple purposes. First, it operates as an electrostatically controlled surface that can be controlled so as to repulsively force (bias negative) active electrons in an engineered direction; or to amplify the ground potential (bias positive) to reduce plasma impedance. Second, it provides a magnetically enhanced channel wherein charges are directed to or away from the electrostatically controlled surface. Third, it provides a controllable axial electromagnetic field that is useful in management of field polarity at various points across the target cathode radius. A side view of this assembly is shown in FIG. 4. FIG. 5 is a top view of the assembly.

The can assembly is generally constructed as a cylinder wherein the inner dimension is larger than the outer dimension of the tri-target assembly. This dimension engineering determines how effective the conjoined assemblies (can+tri-target) are at moving charge to the desired location. Accordingly, we find that a separation between 10 mm and 100 mm is advantageous and that approximately 40 mm is preferable. Below this range, it is intractable to control the flow of charge in the evacuated space.

Just outside the inner wall, pockets are provided that house permanent magnets that may run the length of the cylinder. These magnets are oriented such that the polarity axis is parallel with the length of the cylinder as well as parallel with the polarity of the magnets contained in the tri-target assembly. The presence of this magnet array bolsters the cathode pass through field in a direction predominantly orthogonal to the cathode and substrate. Also the can magnet field strengthens the return magnetic field through the center of the target cathode. This is essential to derive a zero-crossing polarity point at a location within the radius of the target.

In another embodiment, it is found to be effective to place similar permanent magnets around the periphery of the can that have an orthogonal (with respect to the surface of the can cylinder) polarity.

To provide the axial field of reverse polarity to the tri-target assembly magnets, a coil 212 is wrapped around the outer dimension of the can assembly. Although not necessary, it is convenient to wrap the coil around the section housing the permanent magnets described above. This may be observed again in FIGS. 4 and 5. By careful selection of wire gauge, and power supply, a controllable field is observed within the inner core dimensions of the primary cathode target. This opens an opportunity to engineer where the primary erosion groove occurs upon the target surface. Since the coil field is substantially less than that of the permanent magnet pass through field, the resulting magnetron is Type II (unbalanced). As the coil current is increased, we see the zero-crossing point (where the field is observed to switch direction) to occur at a dimension increasingly closer to the outer dimension of the primary cathode target. This has profound effects on the resultant film uniformity and target utilization. Because the resultant magnetron is essentially Type II, the plasma is largely confined in the space within the core of the pass-through field. Secondly, due to the dense presence of thermalized electrons (donated from the below facing-target apparatus), the ionization cross-section for both gas atoms (e.g., argon) and adsorbate atoms is high. This results in full surface erosion as long as the diameter of the primary cathode target is approximately equal to the width of the pass-through field. Full surface erosion is particularly advantageous in terms of target utilization, but also as a means to reduce or inhibit re-deposition or nodule formation. However, even though the plasma is universal within the field core, the physics are such that the highest ionization cross-section remains at the zero-crossing; the sputter efficiency is thus higher at this location. For this reason, it is crucial to control where this resultant erosion groove occurs, and it is common to design it as close to the outer dimension of the cathode as would be reasonable. This offers the best combination of film uniformity and target utilization.

The combination of the permanent magnet pass-through field and the axial coil driven field provide a novel engineering pathway for the creation of type I or II magnetrons within smaller dimensions. It is intractable to produce magnet packs that are capable of producing high sputter efficiency, full surface erosion, and at low working pressures for targets less than 150 mm in diameter. However, with the novel use of the axial electromagnetic field, we observe no such limitation. Accordingly, using the equation $B=N(\mu_0 I/2R)$, where N is the number of turns, $\mu_0$ is the vacuum permeability ($4\pi \times 10^{-7}$ T m/A), I is the current in the coil, and R is the radius of the coil loop, we observe coil fields in the range of 10 G to 20 kG to be the proper range for a wide range of magnetic and non-magnetic cathode materials to be sputtered and preferably for the model setup 120 G.

Diamond-like carbon (DLC) films are observed with very high film density (>3.0 g/cc) and high film hardness (>60 GPa) owing to a significant portion of the carbon bonding structure being of the $sp^3$ nature. The films are also produced without an appreciable presence of particulates observed in the size range of 0.1 μm-2 μm. The unbalanced nature of the magnetic field distribution across the primary cathode leads to a significant portion of the electron and ion flux being directed at the substrate.

Figure 6:
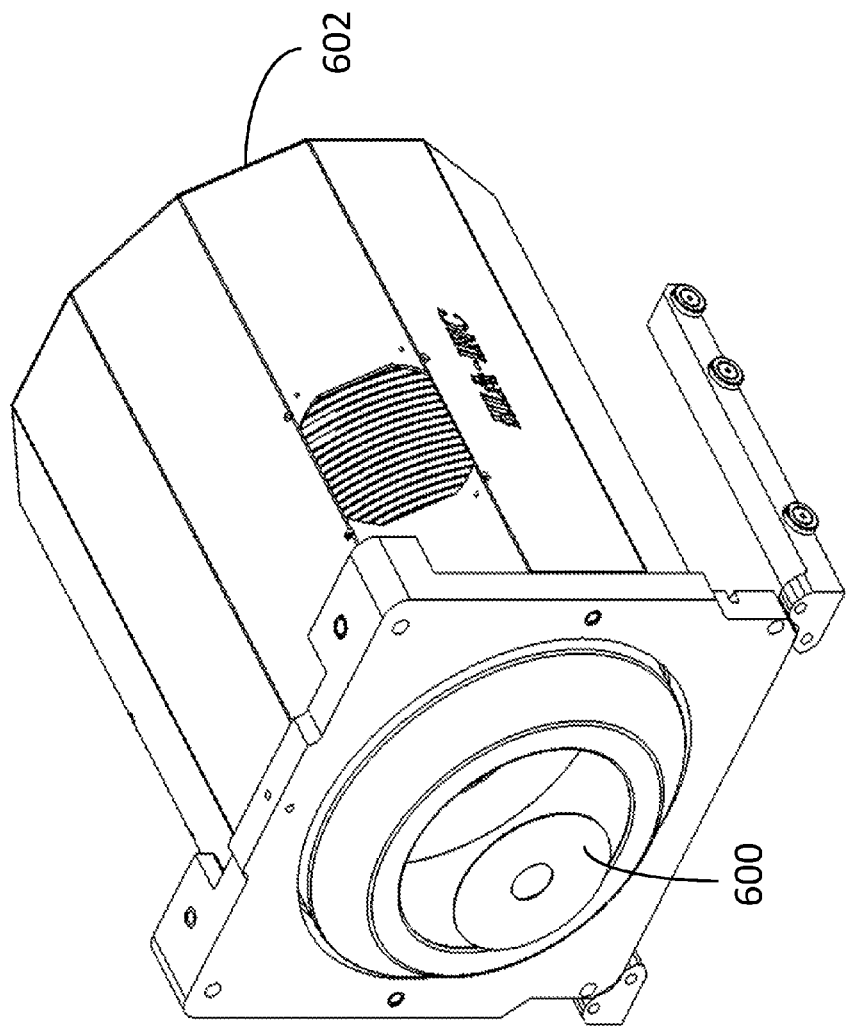
FIG. 6 is a perspective view of the device housing and associated target substrate to be processed.

In one embodiment, a sample film is prepared in the following manner. As shown in FIG. 6, a substrate 600 to be coated with DLC is transported in-situ to the previously disclosed chamber, which is depicted as 602. A sealing dome (not shown) places the substrate 600 in fluid communication with the output of the chamber 602. A base vacuum level below 0.001 Pa and more preferably below 0.0001 Pa is provided through common vacuum engineering methods. A working pressure of argon is then produced to 0.05 Pa. The primary cathode comprised of graphite carbon target material is connected to a dc power supply and is set for 1 kW. Prior to engaging the FTS targets, the primary cathode 102 will not initiate plasma and will assume the voltage limit of the power supply (e.g., −800 V). Next, the FTS is engaged at a desired power setting (typically between 25 W and 1 kW). When this plasma is struck, the plasma immediately appears above the primary cathode 102 thereby initiating erosion. The substrate 600 is held some 50-500 mm away from the primary cathode surface. Due to the high ionization potential of the electron plasma and the low mean free path afforded by the low working pressure, a highly ionized adsorbate is directional toward the substrate. The dynamics of the process can be further modified through judicious use of substrate bias. This for two reasons: 1) the plasma has momentum in the direction of the substrate 600 and 2) the fact that the adsorbate is ionized and therefore responsive to electrostatics.

After ignition of the primary cathode 102, it is generally found that the FTS pair 110, 112 can be extinguished while the primary cathode continues being sputtered. However, one may find that is advantageous to periodically re-light the FTS targets to promote more electron generation into the primary cathode cavity. The authors envision this as a modality for use of the technology in conjunction with insulating or semiconducting materials wherein the promotion of secondary electrons from the sputter process is scarce.

Thus, the disclosed technology enables low pressure and high sputter efficiency processing. A high flux density of electrons is provided to the primary cathode workspace via a coaxial pair of facing targets. The physics associated with operation of this annular cathode pair mandate an electron cage via the confinement provided by the connecting magnetic field. In order for a circuit to close thus allowing stable operation of the device, electrons must obtain ground. Since the cage effect prohibits charged electrons from finding ground, it is the flux of thermalized electrons that are not affected by the cage that ultimately connect to ground. This is depicted in FIG. 4. Since they are inherently low energy, it takes a large number ($>1\times10^{18}$/cc) to accomplish the required connection. This group of thermalized electrons acts akin to a gas and fills the vacant cavity including the space above the primary cathode. This dense supply of particles then serves to reduce the plasma impedance relative to the primary cathode, and thus enables ignition of plasma at lower gas pressure. The resulting plasma density is high and readily ionizes the adsorbate flux emanating from the primary cathode surface. Together, these innovations provide new freedoms within the conventional process space affording the thin film engineer greater opportunities to control and enhance coating quality, e.g., high density carbon.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An apparatus, comprising:
   a primary cathode configured for free space interaction with a substrate operative as an anode; a first annular cathode with a first annulus surface within a first diameter and a second annular cathode with a second annulus surface within a second diameter, wherein the first annulus surface faces the second annulus surface and wherein the primary cathode, the first annular cathode, the second annular cathode are axially aligned and the first diameter and the second diameter are at or within an outer diameter of the primary cathode, wherein the primary cathode is a solid disk located between the substrate and the first annular cathode and the second annular cathode, the first annulus surface and the second annulus surface generating electrons that are used in generation of plasma on the primary cathode and above the substrate;

wherein the primary cathode is sputtered by the plasma to deposit material on the substrate with controllable plasma density to levels above $1\times10^{18}$ m$^{-3}$, with ignition capability at a working pressure to 0.05 Pa.

2. The apparatus of claim 1 further comprising a utility manifold at atmospheric pressure to deliver power, cooling water and process gas.

3. The apparatus of claim 1 further comprising an arrangement of permanent magnets situated behind the primary cathode, the first annular cathode and the second annular cathode, wherein the permanent magnets have aligned polarities.

4. The apparatus of claim 3 wherein the arrangement of permanent magnets creates a free space magnetic field between 100 G to 800 G.

5. The apparatus of claim 4 wherein the arrangement of permanent magnets creates a free space magnetic field of approximately 500 G.

6. The apparatus of claim 1 wherein the composition of the first annular cathode and the second annular cathode is selected from aluminum alloys, other metals, or carbon.

7. The apparatus of claim 1 wherein the first annular cathode and the second annular cathode are separated between 10 and 30 mm.

8. The apparatus of claim 7 wherein the first annular cathode and the second annular cathode are separated approximately 25 mm.

9. The apparatus of claim 1 further comprising a circular permanent magnet placed in the center behind the primary cathode.

10. The apparatus of claim 1 further comprising an additional sub-assembly that is concentric to the primary cathode, the first annular cathode and the second annular cathode such that an inner diameter of the additional sub-assembly is at least 10 mm greater than the outer diameter of the primary cathode, the first diameter and the second diameter.

11. The apparatus of claim 1 further comprising an additional sub-assembly that is concentric to the primary cathode, the first annular cathode and the second annular cathode such that an inner diameter of the additional sub-assembly is between 20 mm to 100 mm greater than the outer diameter of the primary cathode, the first diameter and the second diameter.

12. The apparatus of claim 10 with the additional sub-assembly further comprising an array of permanent magnets.

13. The apparatus of claim 12 wherein the array of permanent magnets generates magnetic strength exceeding 5 MGOe.

14. The apparatus of claim 12 wherein magnetic polarity of the array of permanent magnets is substantially orthogonal to the array of permanent magnets.

15. The apparatus of claim 12 further comprising a coil wrapped about the array of permanent magnets.

16. The apparatus of claim 15 wherein the coil produces axial magnetic fields of between 10 G and 2 kG.

17. The apparatus of claim 15 wherein the coil produces axial magnetic fields of approximately 100 G.

18. The apparatus of claim 10 wherein the additional sub-assembly is held at a positively biased potential with respect to ground.

19. The apparatus of claim 10 wherein the additional sub-assembly is held at a negatively biased potential with respect to ground.

20. The apparatus of claim 10 fitted with additional shielding material to absorb waste material not consumed by the substrate.

* * * * *